(12) United States Patent
Yu et al.

(10) Patent No.: US 9,538,685 B2
(45) Date of Patent: Jan. 3, 2017

(54) POWER DISTRIBUTION DEVICE AND ASSEMBLING METHOD THEREOF

(71) Applicants: LITE-ON ELECTRONICS (GUANGZHOU) LIMITED, Guangzhou (CN); LITE-ON TECHNOLOGY CORP., Taipei (TW)

(72) Inventors: Kai-Khuan Yu, Taipei (TW); Nien-Hung Yao, Taipei (TW); Hsin-Yu Yang, Taipei (TW); Yu-Shan Kao, Taipei (TW)

(73) Assignees: Lite-On Electronics (Guangzhou) Limited, Guangzhou (CN); Lite-On Technology Corp., Taipei (TW)

(*) Notice: Subject to any disclaimer, the term of this patent is extended or adjusted under 35 U.S.C. 154(b) by 197 days.

(21) Appl. No.: 14/318,843

(22) Filed: Jun. 30, 2014

(65) Prior Publication Data
US 2015/0043131 A1 Feb. 12, 2015

(30) Foreign Application Priority Data
Aug. 8, 2013 (CN) .......................... 2013 1 0345203

(51) Int. Cl.
*H02B 1/26* (2006.01)
*H02B 3/00* (2006.01)
*H05K 7/14* (2006.01)

(52) U.S. Cl.
CPC .............. *H05K 7/1492* (2013.01); *H02B 1/26* (2013.01); *H05K 7/1457* (2013.01); *Y10T 29/49213* (2015.01)

(58) Field of Classification Search
CPC ................................ H05K 7/1457; H02B 1/26
See application file for complete search history.

(56) References Cited

U.S. PATENT DOCUMENTS

| | | | | |
|---|---|---|---|---|
| 4,685,032 | A * | 8/1987 | Blomstedt | H05K 7/1457 361/624 |
| 4,862,326 | A * | 8/1989 | Blomstedt | H05K 7/1457 361/622 |
| 6,293,828 | B1 * | 9/2001 | Colver | H05K 7/1457 439/680 |
| 6,392,901 | B1 * | 5/2002 | Colver | H05K 7/1457 312/223.2 |
| 6,402,566 | B1 * | 6/2002 | Middlehurst | H01R 13/113 439/680 |
| 6,814,590 | B2 * | 11/2004 | Minich | H01R 12/727 439/79 |
| 7,258,562 | B2 * | 8/2007 | Daily | H01R 13/113 439/290 |

(Continued)

*Primary Examiner* — Robert J Hoffberg
(74) *Attorney, Agent, or Firm* — Rosenberg, Klein & Lee

(57) ABSTRACT

A power distribution device for connection with a plurality of power supply units includes a signal control element, a transmission mechanism including a current transmission unit and a ground transmission unit, and a plurality of electrical connectors respectively adapted for insertion of and connection with the power supply units. Each electrical connector includes a first conductive terminals electrically connected to the signal control element for transmitting an electrical signal to the signal control element, and a plurality of second conductive terminals electrically connected to the current and ground transmission units for transmitting current to the current and ground transmission units.

12 Claims, 12 Drawing Sheets

(56) References Cited

U.S. PATENT DOCUMENTS

| | | | | |
|---|---|---|---|---|
| 7,458,839 | B2* | 12/2008 | Ngo | H01R 12/7088 |
| | | | | 439/291 |
| 7,782,632 | B2* | 8/2010 | Della Fiora | H05K 7/1454 |
| | | | | 29/825 |
| 7,789,714 | B2* | 9/2010 | Liu | H01R 12/58 |
| | | | | 439/682 |
| 7,791,865 | B2* | 9/2010 | Wirtzberger | H05K 7/1457 |
| | | | | 200/50.26 |
| 8,062,046 | B2* | 11/2011 | Daily | H01R 13/113 |
| | | | | 439/290 |
| 8,081,422 | B2* | 12/2011 | Shannon | H05K 7/1457 |
| | | | | 307/43 |
| 8,419,476 | B1* | 4/2013 | Yu | H01R 24/20 |
| | | | | 439/540.1 |
| 2015/0271946 | A1* | 9/2015 | Bemat | H01R 13/642 |
| | | | | 361/622 |

* cited by examiner

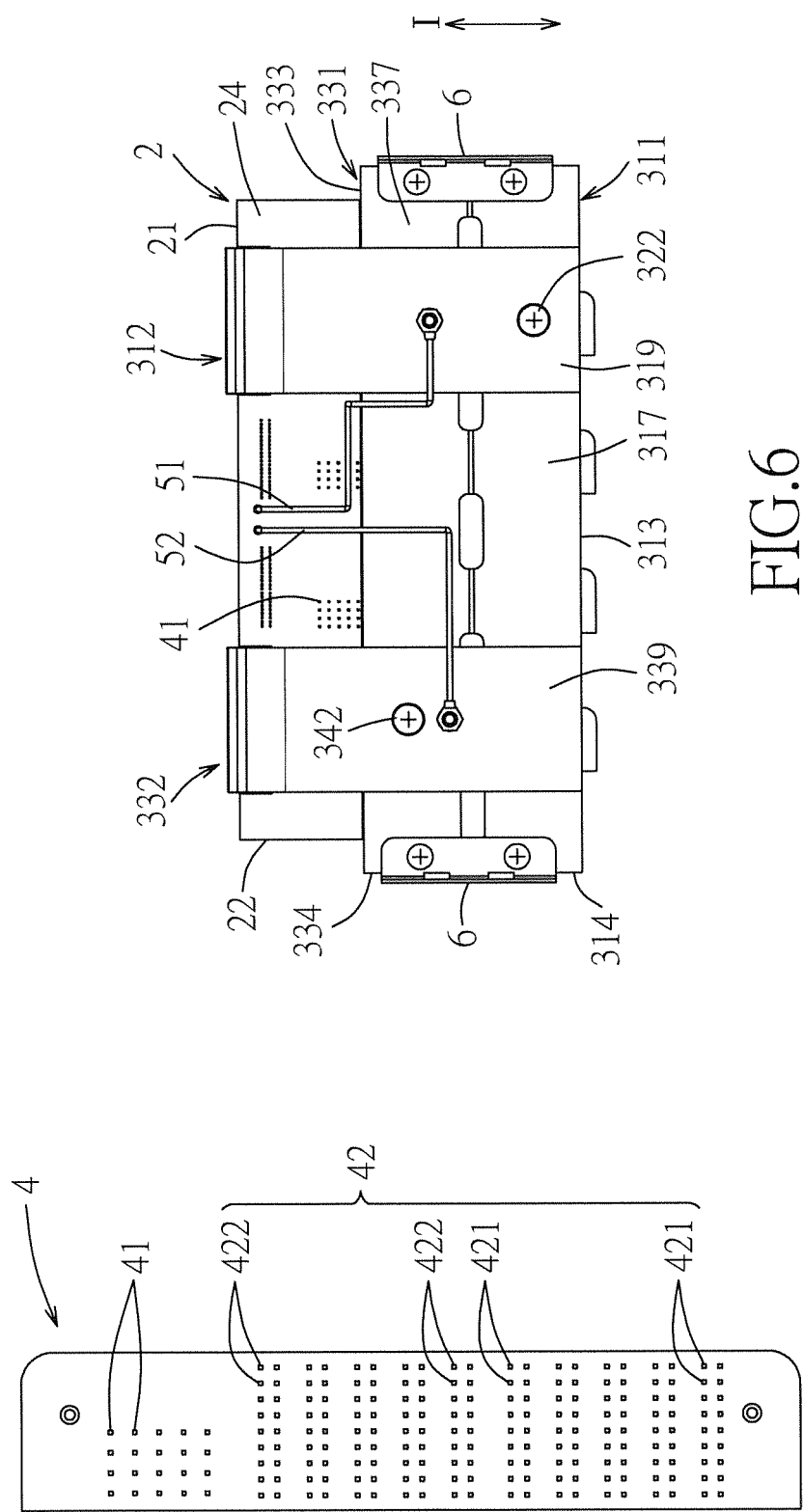

US 9,538,685 B2

POWER DISTRIBUTION DEVICE AND ASSEMBLING METHOD THEREOF

CROSS REFERENCE TO RELATED APPLICATION

This application claims priority of Chinese Application No. 201310345203.X, filed on Aug. 8, 2013, the disclosure of which is incorporated herein by reference.

BACKGROUND OF THE INVENTION

1. Field of the Invention

The invention relates to a power distribution device, and more particularly to a power distribution device for distributing current supplied by a power supply unit to a power distribution system and an assembling method thereof.

2. Description of the Related Art

Generally, a power distribution device is used for distributing current supplied by a power supply unit to a power distribution system for use according to the requirement thereof.

Referring to FIGS. 1 and 2, an existing power distribution device 1 includes a casing 11, a motherboard 12 disposed in the casing 11, a circuit board 13 disposed in the casing 11 and spacedly below the motherboard 12, two conductive supports 14, two signal transmission elements 15, and two output elements 16. Each of the motherboard 12 and the circuit board 13 is provided with a plurality of electrical connectors 17, 18. Each electrical connector 17, 18 is used for insertion of a power supply unit (not shown). Current and signal generated by the power supply unit are transmitted to the motherboard 12 and the circuit board 13 through the corresponding electrical connectors 17, 18. Each conductive support 14 is electrically connected between the motherboard 12 and the circuit board 13 for transmitting current. Each signal transmission element 15 is electrically connected between the motherboard 12 and the circuit board 13 for transmitting a signal.

Each output element 16 is electrically connected to the motherboard 12 through a plurality of transmission wires 161 for outputting the current and the signal required by the system. A portion of the power supply unit will send the current and the signal directly to the motherboard 12 through the electrical connectors 17. The other portion of the power supply unit will send the current and the signal to the circuit board 13 through the electrical connectors 18, after which the current and the signal are transmitted to the motherboard 12 through the conductive supports 14 and the signal transmission elements 15, respectively. Through this, the motherboard 12 can send the current and the signal required by the system to the system through the output elements 16.

Because the current generated by the power supply unit is transmitted to the circuit board 13 through the electrical connectors 18 and is then transmitted to the motherboard 12 through the conductive supports 14 so that the current can be outputted to the system through the output elements 16, the transmission path of the current is long, and loss of current during transmission may easily occur. Further, if it is desired to transmit large current through the circuit board 13 and the motherboard 12, the thickness of the copper foil of each of the circuit board 13 and the motherboard 12 must be increased in order to meet the requirement for transmission of large current. A high manufacturing cost will incur as a result. Thus, the existing power distribution device 1 is not suitable for use in transmission of large current. Moreover, since the existing power distribution device 1 has numerous components, the assembly thereof is complicated and consumes a lot of time.

Currently, application of cloud equipment is more and more extensive. In order for the cloud equipment to have fast and large computing function, the power used by the cloud equipment must be high. When the size and the number of the power supply unit disposed in an interior of the cloud equipment are increased, this will adversely affect an accommodation space of the power distribution device 1. Thus, there remains a need to improve the structural design of the existing power distribution device 1.

SUMMARY OF THE INVENTION

Therefore, an object of this invention is to provide a power distribution device that can shorten a transmission path of current and that can reduce loss of current during transmission.

Another object of this invention is to provide a power distribution device that can conduct transmission of large current through a transmission mechanism.

Yet another object of this invention is to provide a power distribution device that has a small size so as to effectively reduce an occupied space.

Still another object of this invention is to provide a power distribution device that can enhance heat dissipation effect.

According to one aspect of this invention, a power distribution device for connection with a plurality of power supply units comprises a signal control element, a transmission mechanism including a current transmission unit and a ground transmission unit, and a plurality of electrical connectors respectively adapted for insertion of and connection with the power supply units. Each electrical connector includes a first conductive terminals electrically connected to the signal control element, and a plurality of second conductive terminals electrically connected to the current and ground transmission units. The first conductive terminals are configured for transmitting an electrical signal to the signal control element. The second conductive terminals are configured for transmitting current to the current and ground transmission units.

Still yet another object of this invention is to provide an assembly method of a power distribution device that can permit easy and quick assembly to shorten the assembly time.

According to another aspect of this invention, an assembly method of a power distribution device comprises the steps of: (A) aligning a plurality of electrical connectors with a signal control element, a current transmission unit and a ground transmission unit such that a plurality of first conductive terminals of each electrical connector that are used for transmitting an electrical signal face the signal control element, and a plurality of second conductive terminals of each electrical connector that are used for transmitting current face the current transmission unit and the ground transmission unit; (B) inserting the first conductive terminals of each electrical connector into the signal control element, and inserting the second conductive terminals of each electrical connector into the current transmission unit and the ground transmission unit; and (C) soldering the first conductive terminals of each electrical connector to the signal control element so as to electrically connect the first conductive terminals to the signal control element, and soldering the second conductive terminals of each electrical connector to the current transmission unit and the ground transmission unit so as to electrically connect the second conductive terminals to the current transmission unit and the ground transmission unit.

The efficiency of this invention resides in that because the first conductive terminals of each electrical connector are electrically connected to the signal control element, and the second conductive terminals of each electrical connector are electrically connected to the current transmission unit and the ground transmission unit, current outputted from each power supply unit can be supplied directly to the motherboard of the system through each electrical connector and the transmission mechanism. Through this, a transmission path of the current can be effectively shortened and loss of the current during transmission can also be reduced, so that the power distribution device can conduct large power and large current transmitting operation. Furthermore, because of the elongated structure and arrangement of the signal control element, the first conductive plate and the second conductive plate, and because of the arrangement and disposition of the electrical connectors on the signal control element, the first conductive plate and the second conductive plate, the space occupied by the power distribution device in the metal housing of the system can be minimized. Moreover, because the current transmission unit and the ground transmission unit of the transmission mechanism are made of metal conductive materials, the temperature will not easily rise during transmission of the current, so that the heat dissipation effect of the entire power distribution device is good. Additionally, because the assembling method of the electrical connectors with the signal control element, the current transmission unit and the ground transmission unit is easy and quick, the assembly time thereof is shortened.

BRIEF DESCRIPTION OF THE DRAWINGS

Other features and advantages of the present invention will become apparent in the following detailed description of the preferred embodiments with reference to the accompanying drawings, of which:

FIG. 5 is a rear schematic view of an electrical connector of the first preferred embodiment;

FIG. 6 is a rear schematic view of FIG. 3;

DETAILED DESCRIPTION OF THE PREFERRED EMBODIMENTS

Figure 1:
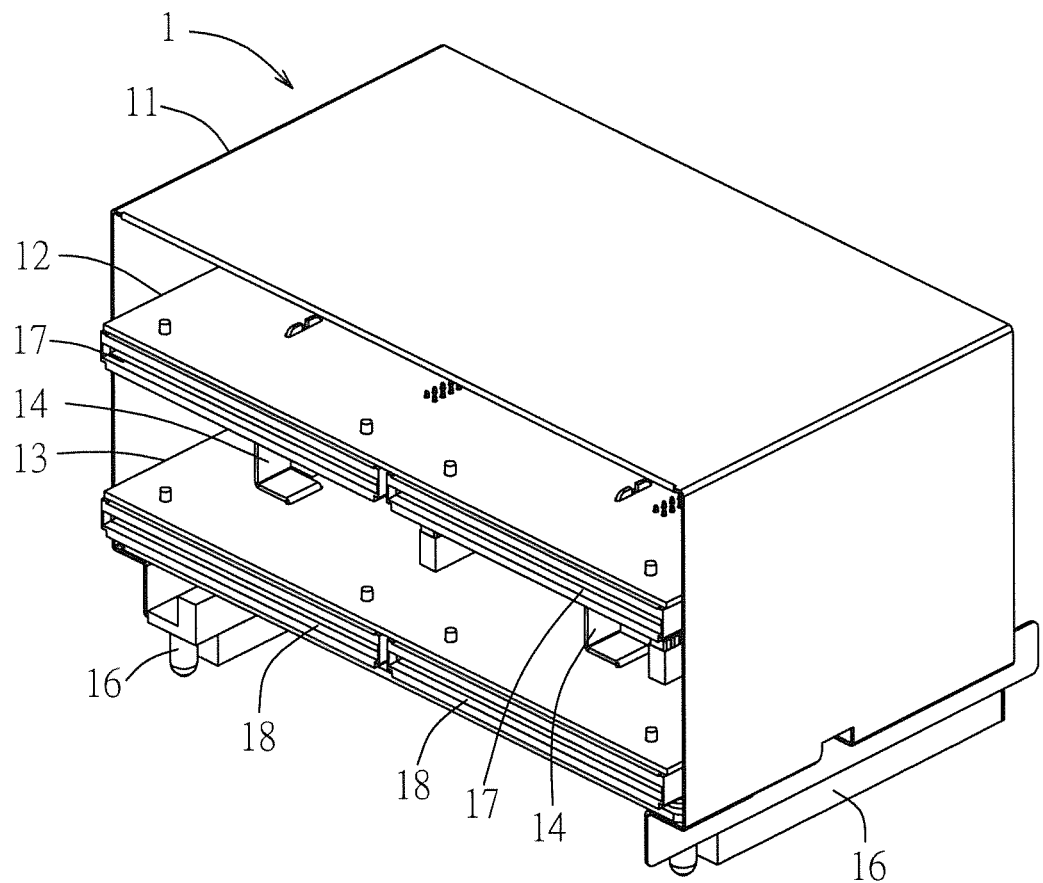
FIG. 1 is a perspective view of an existing power distribution device.
Figure 2:
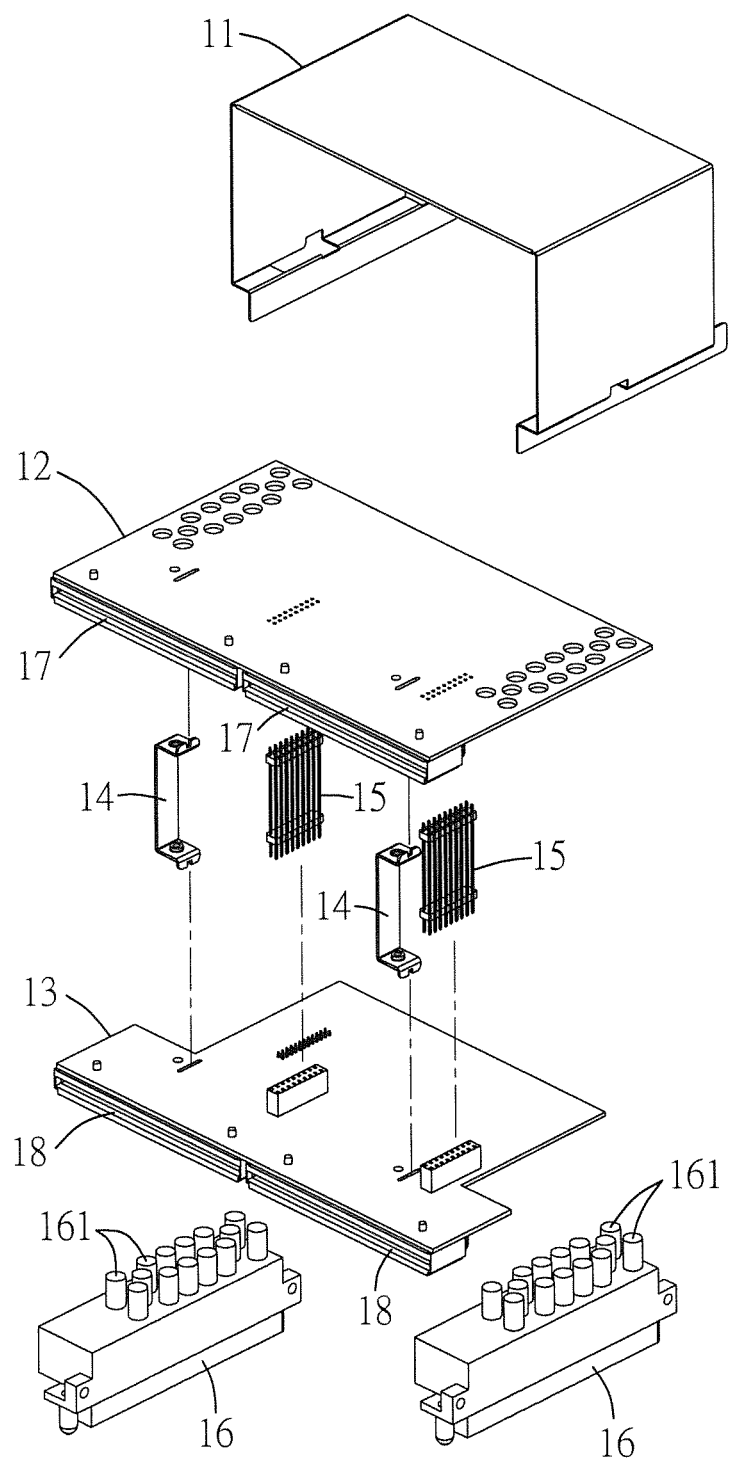
FIG. 2 is an exploded perspective view of the existing power distribution device.

Before the present invention is described in greater detail, it should be noted that like elements are denoted by the same reference numerals throughout the disclosure.

Figure 3:
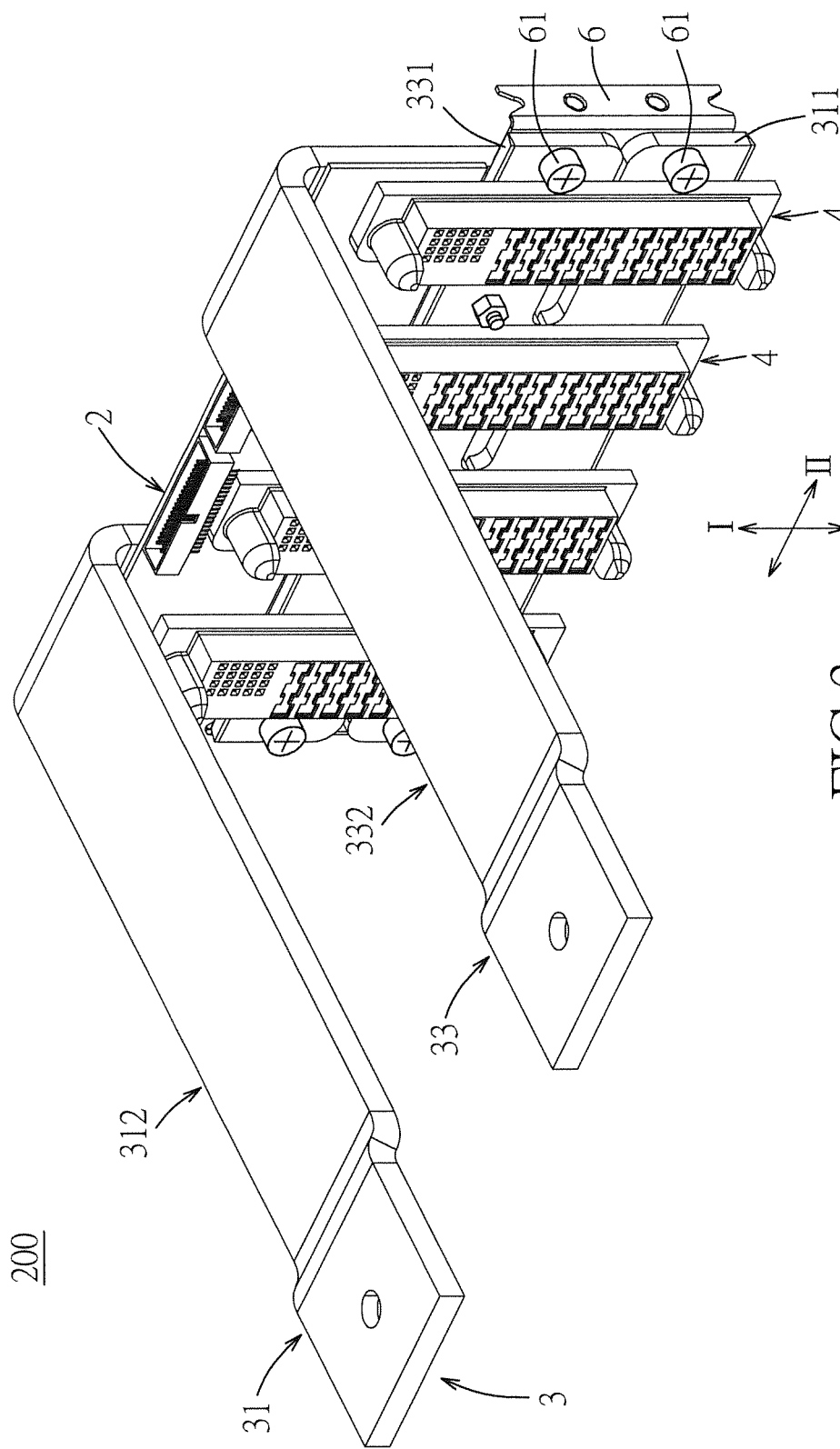
FIG. 3 is a perspective view of a power distribution device according to the first preferred embodiment of the present invention.
Figure 4:
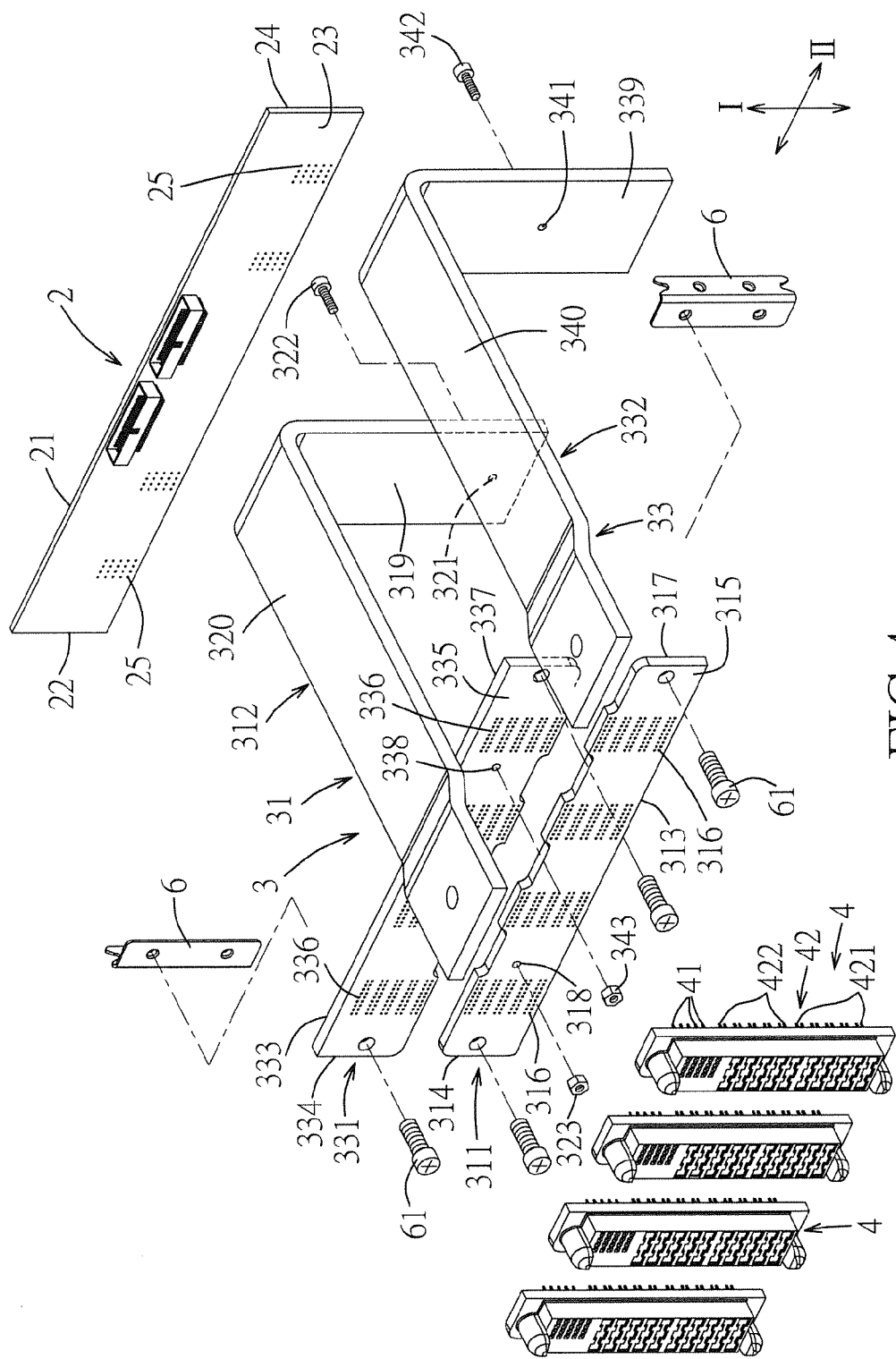
FIG. 4 is an exploded perspective view of the first preferred embodiment.

Referring to FIGS. 3 and 4, a power distribution device 200 according to the first preferred embodiment of the present invention is suitable for connection with a plurality of power supply units (not shown), and is shown to comprise a signal control element 2, a transmission mechanism 3 and a plurality of electrical connectors 4.

The transmission mechanism 3 includes a current transmission unit 31 and a ground transmission unit 33. Each of the current transmission unit 31 and the ground transmission unit 33 is made of a material having a conductive function. For example, the material may be a metal or other conductive material. In this embodiment, each of the current and ground transmission units 31, 33 is made of metal. The electrical connectors 4 are disposed on the signal control element 2 and the transmission mechanism 3 for insertion of and connection with the power supply units. Each electrical connector 4 includes a plurality of first conductive terminals 41 electrically connected to the signal control element 2, and a plurality of second conductive terminals 42 electrically connected to the current transmission unit 31 and the ground transmission unit 33. The first conductive terminals 41 are used for transmitting an electrical signal to the signal control element 2. The signal control element 2 will process the received signal according to the setting requirement of a power distribution system, and then send the processed signal to the system. The second conductive terminals 42 are used for transmitting current to the current and ground transmission units 31, 33. Since the second conductive terminals 42 of each electrical connector 4 are directly and electrically connected to the current and ground transmission units 31, 33, current supplied by each power supply unit can be directly sent to the system through the electrical connectors 4 and the transmission mechanism 3. Through this, a transmission path of the current can be effectively shortened, and loss of the current during transmission can be reduced. Hence, the power distribution device 200 can conduct large power and large current transmitting operation.

In this embodiment, the signal control element 2 is exemplified as a circuit board. Because the circuit board is cheap, has a small size that does not occupy a large space, and is easy to assemble with the other components of this embodiment, it is preferable that the signal control element 2 uses the design method of the circuit board. However, in actual practice, the signal control element 2 may be designed as other form according to the actual requirement.

A concrete structure of the power distribution device 200 will be described in detail below.

Referring to FIG. 5, in combination with FIGS. 3 and 4, the second conductive terminals 42 of each electrical connector 4 are divided into a plurality of current conductive terminals 421 and a plurality of ground terminals 422. The current transmission unit 31 is electrically connected between the current conductive terminals 421 of each electrical connector 4 and a motherboard (not shown) of the system for transmitting the output current of each power supply unit to the motherboard. The ground transmission unit 33 is electrically connected between the ground terminals 422 of each electrical connector 4 and a metal housing (not shown) of the system. The ground transmission unit 33 and the metal housing form a ground path for conducting ground discharge.

Referring to FIG. 6, in combination with FIGS. 4 and 5, the current transmission unit 31 includes a first conductive plate 311 electrically connected to the current conductive terminals, and a current output support 312 disposed on the first conductive plate 311. Each of the first conductive plate 311 and the current output support 312 is made of a metal conductive material. In this embodiment, each of the first conductive plate 311 and the current output support 312 is made of copper which has good conductivity. The ground transmission unit 33 includes a second conductive plate 331 electrically connected to the ground terminals 422, and a ground support 332 disposed on the second conductive plate 331. Each of the second conductive plate 331 and the ground support 332 is made of a metal conductive material. In this embodiment, each of the second conductive plate 331 and the ground support 332 is also made of copper which has good conductivity. Because the first conductive plate 311, the current output support 312, the second conductive plate 331 and the ground support 332 are all made of copper which has good conductivity and high conductive coefficient, impedance is very low, so that during transmission of current by the aforesaid components, it is not easy to cause current loss which may lead to generation of voltage drop. Further, it is also not easy to produce heat loss, so that the temperature during transmission of the current by the aforesaid components is not easily raised. Because the temperature during transmission of the current by the aforesaid components is not easily raised, the overall heat dissipation effect of the power distribution device 200 is good, so that additional disposition of a fan is not required. Thus, the cost for buying the fan can be saved, and an accommodation space for the fan inside the power distribution device 200 can be reduced.

On the other hand, because the current output support 312 is disposed on the first conductive plate 311 in a detachable manner and the ground support 332 is disposed on the second conductive plate 331 also in a detachable manner, the complexity of manufacturing process of the current transmission unit 31 and the ground transmission unit 33 can be reduced, and waste of materials generated during manufacturing can be minimized. Hence, manufacturing time and costs can be effectively reduced. It should be noted that, with the different applications of the power distribution device 200, the current output support 312 and the first conductive plate 311 may be formed integrally as one piece, and the ground support 332 and the second conductive plate 331 may also be formed integrally as one piece, and is not limited to the disclosed embodiment.

The current conductive terminals 421, the ground terminals 422 and the first conductive terminals 41 of each electrical connector 4 are arranged along a first direction (I). In this embodiment, the first direction (I) is an up and down or vertical direction. The signal control element 2, the second conductive plate 331 and the first conductive plate 311 are also arranged along the first direction (I). Each of the signal control element 2, the first conductive plate 311 and the second conductive plate 331 is elongated, and has two long sides 21, 313, 333, and two short sides 22, 314, 334. The first direction (I) is perpendicular to the long sides of the signal control element 2 and the first and second conductive plate 311, 331, and is parallel to the short sides 22, 314, 334 of the signal control element 2 and the first and second conductive plates 311, 331. The signal control element 2, the second conductive plate 331 and the first conductive plate 311 are arranged in the same plane and are adjacent and close to each other in the vertical direction, so that spaces occupied by the signal control element 2, the second conductive plate 331 and the first conductive plate 311 in the metal housing of the system can be reduced to a minimum.

Concretely speaking, in this embodiment, because the first conductive terminals 41, the ground terminals 422 and the current conductive terminals 421 of each electrical connector 4 are arranged from top to bottom along the first direction (I), the signal control element 2, the second conductive plate 331 and the first conductive plate 311 are also arranged from top to bottom along the first direction (I) so as to match the order arrangement of the first conductive terminals 41, the ground terminals 422 and the current conductive terminals 421. It should be noted that the order arrangement of the first conductive terminals 41, the ground terminals 422 and the current conductive terminals 421 of each electrical connector 4 is not limited to the disclosed embodiment, and the arrangement of the signal control element 2, the second conductive plate 331 and the first conductive plate 311 may be adjusted according to actual order arrangement of the first conductive terminals 41, the ground terminals 422 and the current conductive terminals 421.

Moreover, each of the signal control element 2 and the first and second conductive plates 311, 331 further has a front surface 23, 315, 335. The electrical connectors 4 are simultaneously disposed on the front surfaces 23, 335, 315 of the signal control element 2, the second conductive plate 331 and the first conductive plate 311, and are arranged spaced apart from each other along a second direction (II) which is transverse to the first direction (I). The second direction (II) is parallel to the long sides 21, 313, 333 of the signal control element 2 and the first and second conductive plates 311, 331. Through the elongated form of each of the signal control element 2, the second conductive plate 331 and the first conductive plate 311 and their arrangement, many more electrical connectors 4 can be disposed on the signal control element 2, the second conductive plate 331 and the first conductive plate 311 along the second direction (II), so that the power distribution device 200 can provide connection of more power supply units under a limited space condition.

The signal control element 2 further has a rear surface 24, and is formed with a plurality of arrays of insertion holes 25 that extend through the front and rear surfaces 23, 24. The arrays of the insertion holes 25 are used for insertion of and connection with the first conductive terminals 41 of the electrical connectors 4. Through this, each electrical connector 4 can be electrically connected to the signal control element 2 through the first conductive terminals 41. The front surface 315 of the first conductive plate 311 is formed with a plurality of arrays of first insertion holes 316 for insertion of and connection with the current conductive terminals 421 of the electrical connectors 4. Through this, each electrical connector 4 can be electrically connected to the first conductive plate 311 through the current conductive terminals 421. The front surface 335 of the second conductive plate 331 is formed with a plurality of arrays of second insertion holes 336 for insertion of and connection with the ground terminals 422 of the electrical connectors 4. Through this, each electrical connector 4 can be electrically connected to the second conductive plate 331 through the ground terminals 422.

Figure 7:
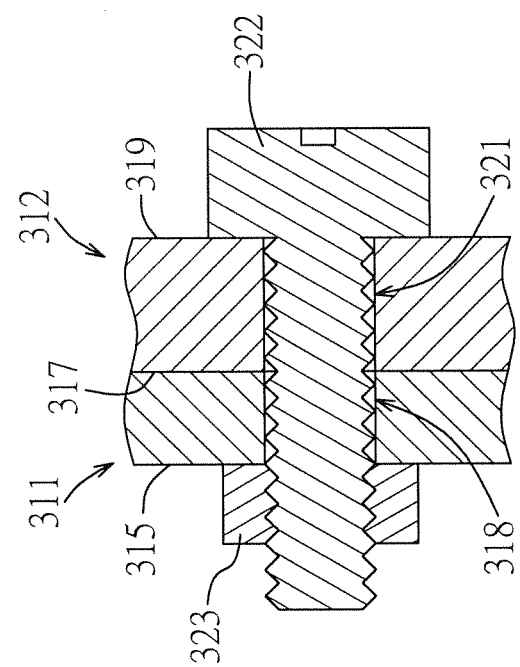
FIG. 7 is an enlarged fragmentary sectional view of the first preferred embodiment, illustrating how a first support of a current output support is fixed to a first conductive plate.

As shown in FIGS. 4, 6 and 7, the first conductive plate 311 further has a rear surface 317, and is formed with a first through hole 318 that extends through the front and rear surfaces 315, 317. The current output support 312 has a recumbent L-shape, and includes a first support 319 extending in the first direction (I), and a second support 320 connected to and extending transversely from a top end of the first support 319. The first support 319 is formed with a first passage hole 321 corresponding to the first through hole 318. The current transmission unit 31 further includes a first screw 322 extending through the first passage hole 321 and the first through hole 318, and a first nut 323 connected to the first screw 322 and abutting against the front surface 315 of the first conductive plate 311. Through engagement of the first screw 322 and the first nut 323, the first support 319 is fixedly connected to and abuts against the rear surface 317 of the first conductive plate 311. This ensures a large connecting area between the first support 319 and the first conductive plate 311, so that the first conductive plate 311 can smoothly transmit large current to the current output support 312. The second support 320 is used for connection with corresponding terminals (not shown) of the motherboard of the system. As such, current supplied by each power supply unit can pass through the electrical connectors 4, the first conductive plate 311 and the current output support 312 and transmit to the motherboard of the system.

Figure 8:
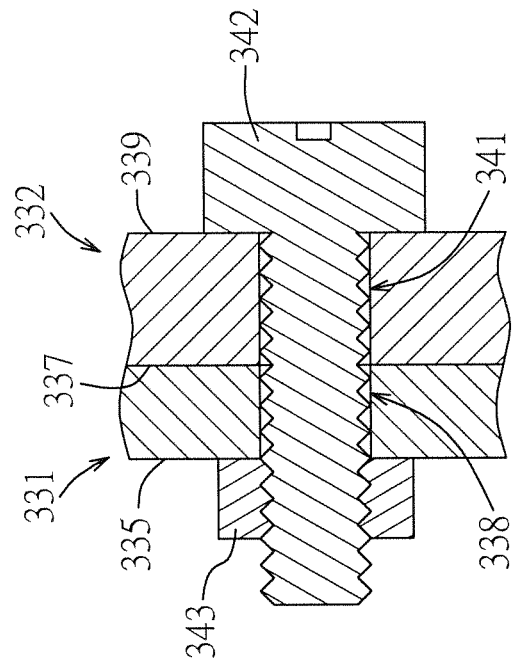
FIG. 8 is another enlarged fragmentary sectional view of the first preferred embodiment, illustrating how a first support of a ground support is fixed to a second conductive plate.

As shown in FIGS. 4, 6 and 8, the second conductive plate 331 further has a rear surface 337, and is formed with a second through hole 338 that extends through the front and rear surfaces 335, 337. The ground support 332 has a recumbent L-shape, and includes a first support 339 extending in the first direction (I), and a second support 340 connected to and extending transversely from a top end of the first support 339. The first support 339 is formed with a second passage hole 341 corresponding to the second through hole 338. The ground transmission unit 33 further includes a second screw 342 extending through the second passage hole 341 and the second through hole 338, and a second nut 343 connected to the second screw 342 and abutting against the front surface 335 of the second conductive plate 331. Through engagement of the second screw 342 and the second nut 343, the first support 339 is fixedly connected to and abuts against the rear surface 337 of the second conductive plate 331. This ensures a large connecting area between the first support 339 and the second conductive plate 331, so that the second conductive plate 331 can smoothly transmit large current to the ground support 332. The second support 340 is used for connection with the metal housing of the system. AS such, current supplied by each power supply unit can pass through the electrical connectors 4, the second conductive plate 331 and the ground support 332 and transmit to the metal housing of the system for conducting ground discharge.

With reference to FIGS. 4 and 6, the power distribution device 200 further comprises a first guide wire 51 and a second guide wire 52. The first guide wire 51 is electrically connected between the signal control element 2 and the first support 319 of the current output support 312. Through this, signal outputted from each power supply unit can be transmitted to the motherboard of the system through the signal control element 2 and the current output support 312. The signal control element 2 will process the signal outputted from each power supply unit according to the requirement of the system. The second guide wire 52 is electrically connected between the signal control element 2 and the first support 339 of the ground support 332 to form a ground effect.

The power distribution device 200 further comprises two connecting members 6 disposed on two opposite longitudinal ends of the first and second conductive plates 311, 331 and spaced apart from each other in the second direction (II). Specifically, each connecting member 6 is fastened to the rear surface 317 of the first conductive plate 311 at one longitudinal end thereof by using a screw 61 and is also fastened to the rear surface 337 of the second conductive plate 331 at one longitudinal end thereof that corresponds to the one longitudinal end of the first conductive plate 311 by using another screw 61. Further, each connecting member 6 is also fastened to the metal housing of the system by using a screw-fastening method. Through this, the power distribution device 200 can be stably fixed to the metal housing.

Figure 9:
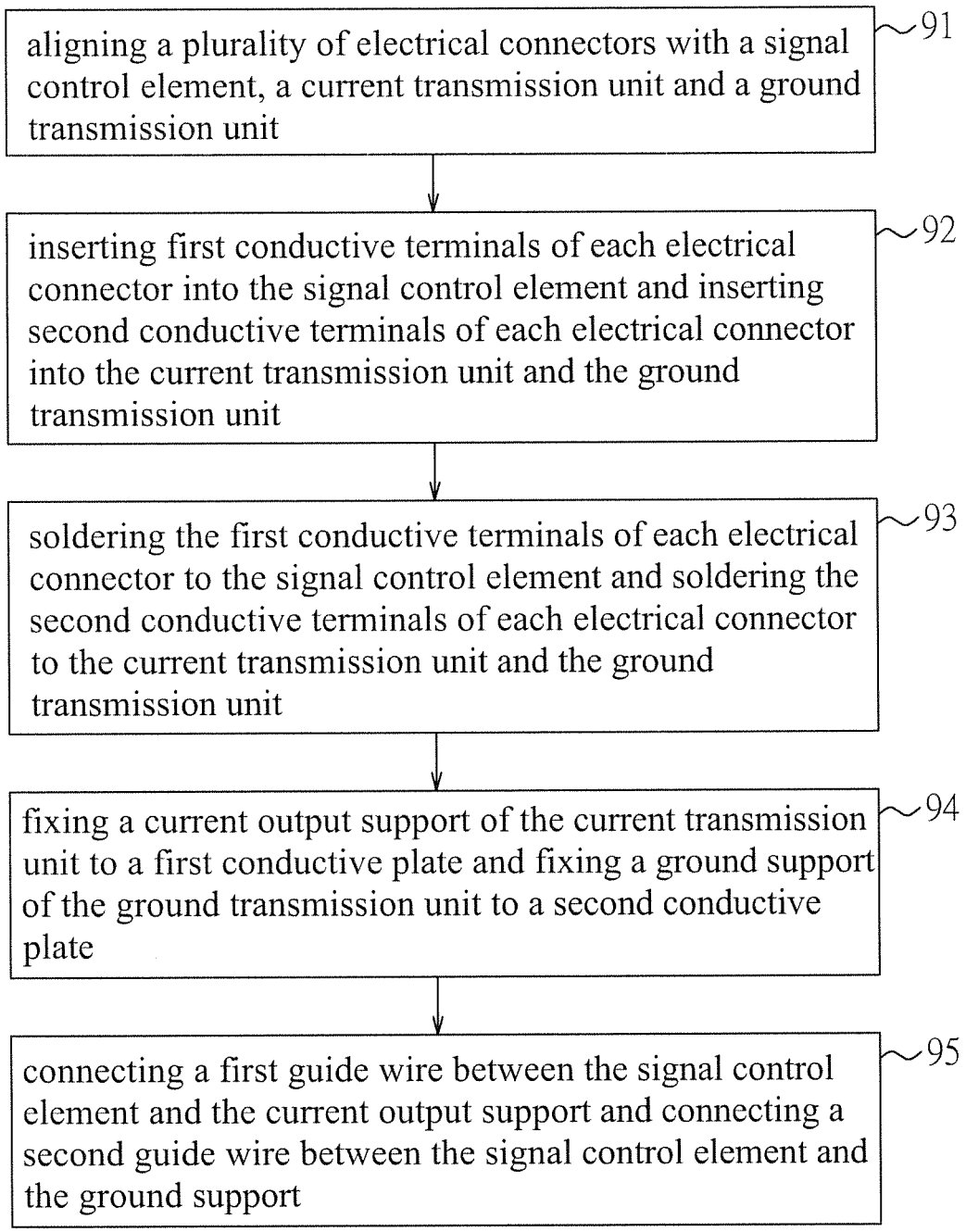
FIG. 9 is a flow chart, illustrating the steps involved in an assembling method of the power distribution device of the first preferred embodiment.
Figure 10:
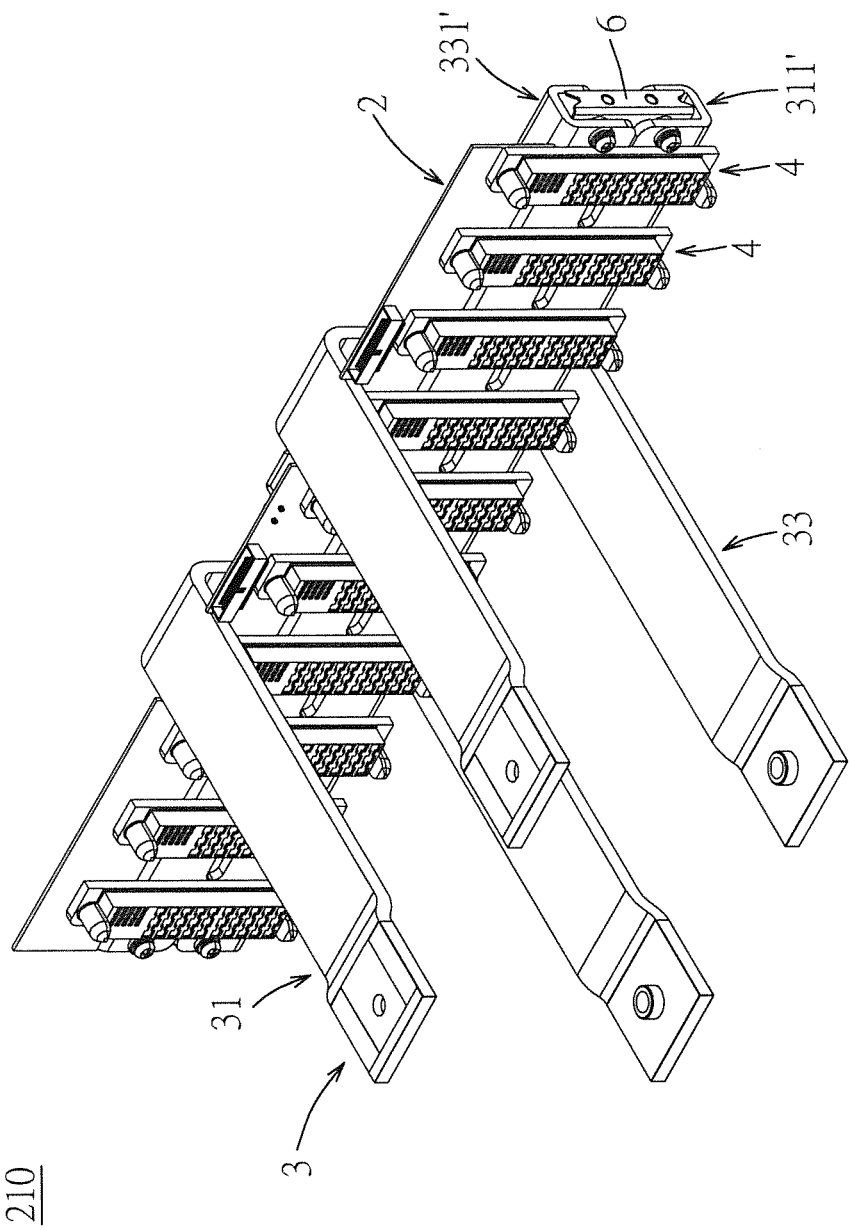
FIG. 10 is a perspective view of a power distribution device according to the second preferred embodiment of the present invention.

Referring to FIG. 9, an assembling method of the power distribution device 200 of this embodiment is shown to include steps 91 to 95.

In step 91, the electrical connectors 4 are disposed in alignment with the signal control element 2, the current transmission unit 31 and the ground transmission unit 33, so that the first conductive terminals 41 of each electrical connector 4 that are used for transmitting an electrical signal are aligned with the signal control element 2 and the second conductive terminals 42 of each electrical connector 4 that are used for transmitting current are aligned with the current transmission unit 31 and the ground transmission unit 33.

In step 92, the first conductive terminals 41 of each electrical connector 4 are inserted into the signal control element 2 and the second conductive terminals 42 of each electrical connector 4 are inserted into the current conduction unit 31 and the ground conduction unit 33.

In step 93, the first conductive terminals 41 of each electrical connector 4 are soldered to the signal control element 2 so as to electrically connect the first conductive terminals 41 to the signal control element 2, and the second conductive terminals 42 of each electrical connector 4 are soldered to the current conduction unit 31 and the ground conduction unit 33 so as to electrically connect the second conductive terminals 42 to the current conduction unit 31 and the ground conduction unit 33.

In step 94, the current output support 312 of the current transmission unit 31 is fixed to the first conductive plate 311 so as to electrically connect the current output support 312 to the first conductive plate 311, and the ground support 332 of the ground transmission unit 33 is fixed to the second conductive plate 331 so as to electrically connect the ground support 332 to the second conductive plate 331.

In step 95, the first guide wire 51 is connected between the signal control element 2 and the current output support 312 so that the first guide wire 51 is electrically connected between the signal control element 2 and the current output support 312, and the second guide wire 52 is connected between the signal control element 2 and the ground support 332 so that the second guide wire 52 is electrically connected between the signal control element 2 and the ground support 332.

Referring again to FIGS. 3, 4 and 9, in step 91, the first conductive terminals 41 of each electrical connector 4 are aligned with the corresponding array of the insertion holes 25 in the signal control element 2, the current conductive terminals 421 of each electrical connector 4 are aligned with the corresponding array of the first insertion holes 316 in the first conductive plate 311, and the ground terminals 422 of each electrical connector 4 are aligned with the corresponding array of the second insertion holes 336 in the second conductive plate 331. Because the first conductive terminals 41, the ground terminals 422 and the current conductive terminals 421 are arranged along the first direction (I) in a top to bottom direction, the signal control element 2, the second conductive plate 331 and the first conductive plate 311 are also arranged along the first direction (I) in the top to bottom direction.

In step 92, the first conductive terminals 41 of each electrical connector 4 are inserted into the corresponding array of the insertion holes 25, the current conductive terminals 421 of each electrical connector 4 are inserted into the corresponding array of the first insertion holes 316, and the ground terminals 422 of each electrical connector 4 are inserted into the corresponding array of the second insertion holes 336.

In step 93, the first conductive terminals 41 of each electrical connector 4 are soldered to the corresponding array of the insertion holes 25 so as to electrically connect the first conductive terminals 41 to the signal control element 2, the current conductive terminals 421 of each electrical connector 4 are soldered to the corresponding array of the first insertion holes 316 so as to electrically connect the current conductive terminals 421 to the first conductive plate 311, and the ground terminals 422 of each electrical connector 4 are soldered to the corresponding array of the second insertion holes 336 so as to electrically connect the ground terminals 422 to the second conductive plate 331. The electrical connectors 4 are simultaneously disposed on the front surfaces 23, 335, 315 of the signal control element 2, the second conductive plate 331 and the first conductive plate 311, and are spaced apart from each other along the second direction (II).

With reference to FIGS. 4 and 7 to 9, in step 94, the first screw 322 is inserted through the first passage hole 321 of the current output support 312 and the first through hole 318 of the first conductive plate 311, and engages with the first nut 323, so that the first support 319 of the current output support 312 can abut against the rear surface 317 of the first conductive plate 311 and electrically connect with the first conductive plate 311. Further, the second screw 342 is inserted through the second passage hole 341 of the ground support 332 and the second through hole 338 of the second conductive plate 331, and engages with the second nut 343, so that the first support 339 of the ground support 332 can abut against the rear surface 337 of the second conductive plate 331 and electrically connect with the second conductive plate 331.

With reference to FIGS. 6 and 9, in step 95, the first guide wire 51 is electrically connected between the signal control element 2 and the first support 319 of the current output support 312, and the second guide wire 52 is electrically connected between the signal control element 2 and the first support 339 of the ground support 332. Afterwards, the two connecting members 6 are screwed to the rear surfaces 317, 337 of the first and second conductive plates 311, 331 at two opposite longitudinal ends thereof, thereby completing the assembly of the power distribution device 200. Through the aforesaid assembling method, an assembly person can easily and quickly perform the assembly of the power distribution device 200, so that the working hours of assembly thereof can be shortened.

It should be noted that, during assembly, the first and second conductive plates 311, 331 may be directly connected to the metal housing of the system without using the connecting members 6. The effect of fixing the power distribution device 200 to the metal housing of the system may be similarly achieved.

Referring to FIGS. 10 to 14, a power distribution device 210 according to the second preferred embodiment of this invention is shown to be similar to the first preferred embodiment. The difference between the first and second preferred embodiments resides in the structure of the current transmission unit 31 and the ground transmission unit 33.

Figure 11:
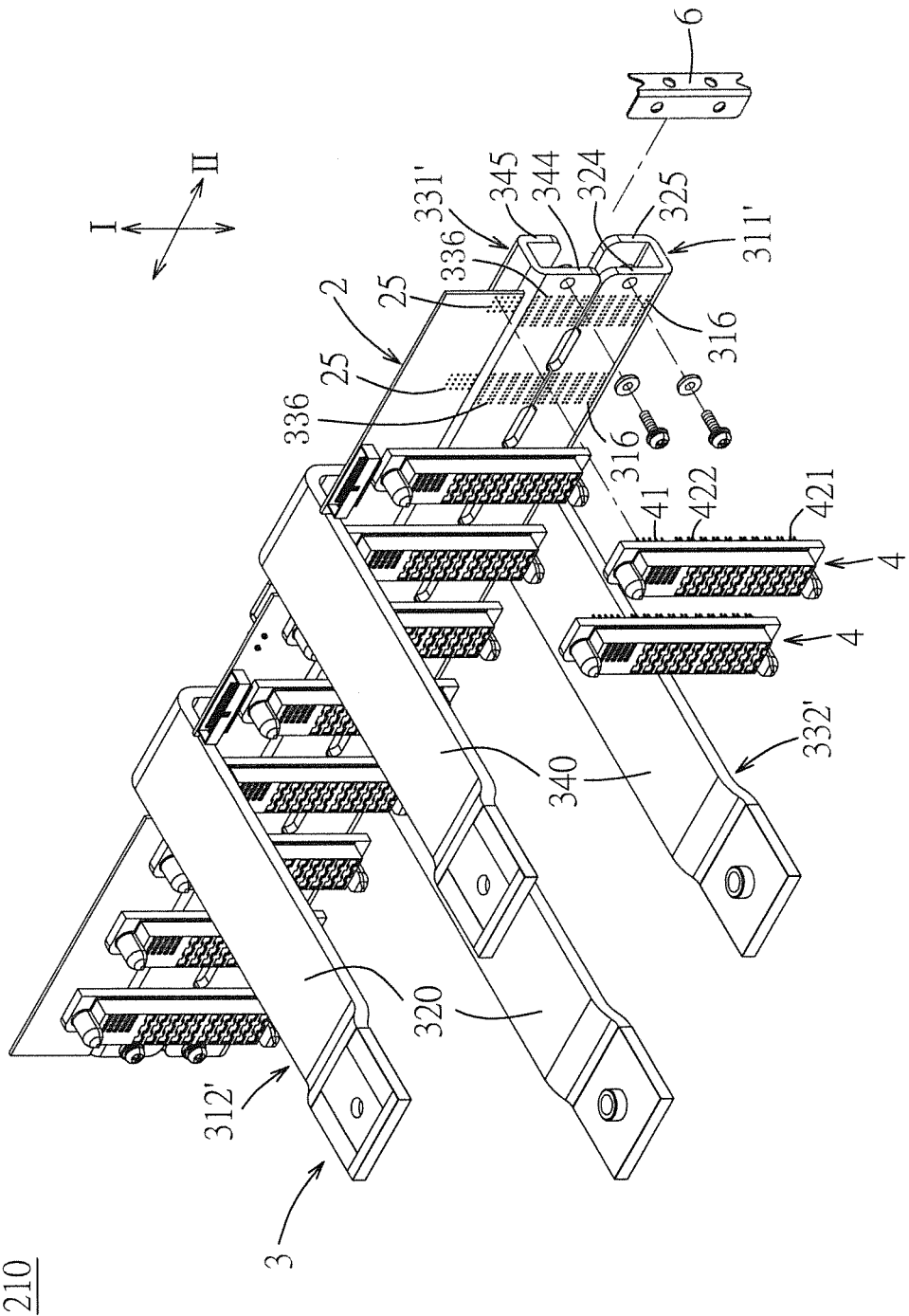
FIG. 11 is a view similar to FIG. 10, but with a portion of the power distribution device being removed for clarity of illustration.
Figure 12:
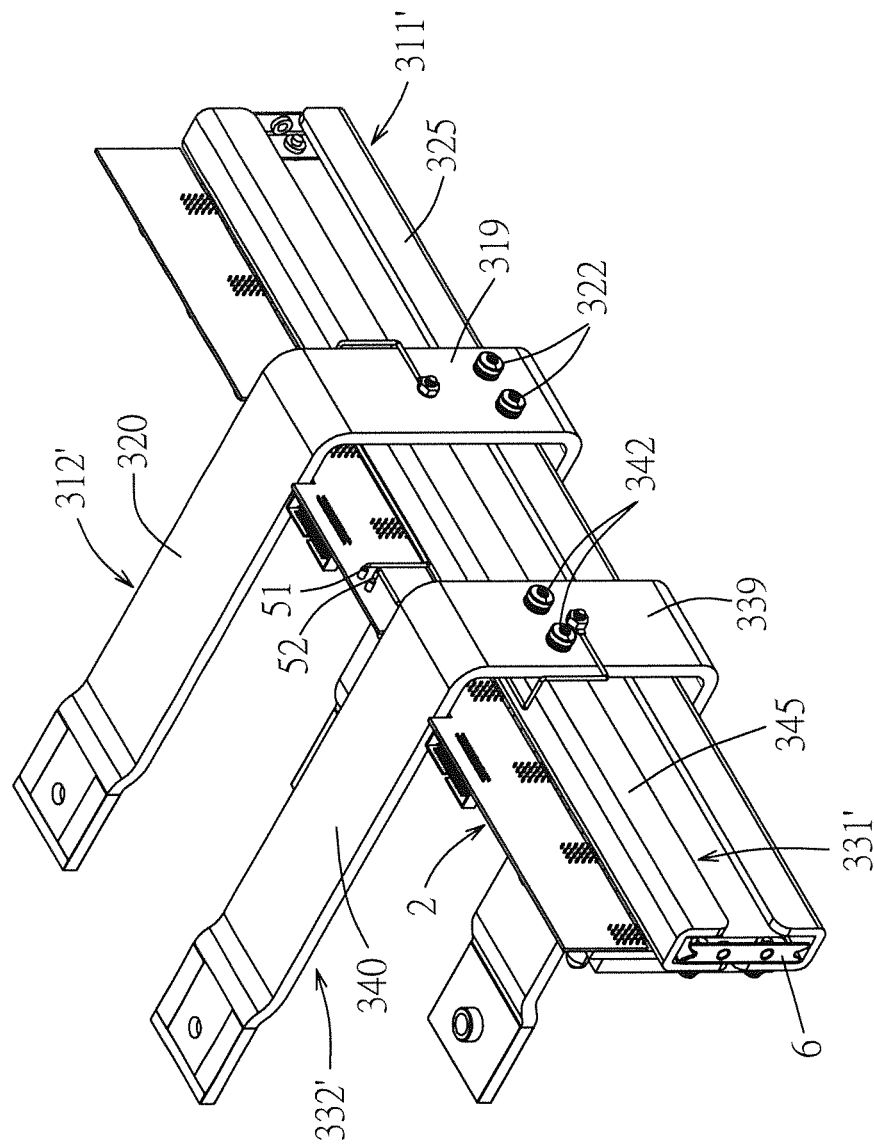
FIG. 12 is another perspective view of the second preferred embodiment taken from another angle.
Figure 13:
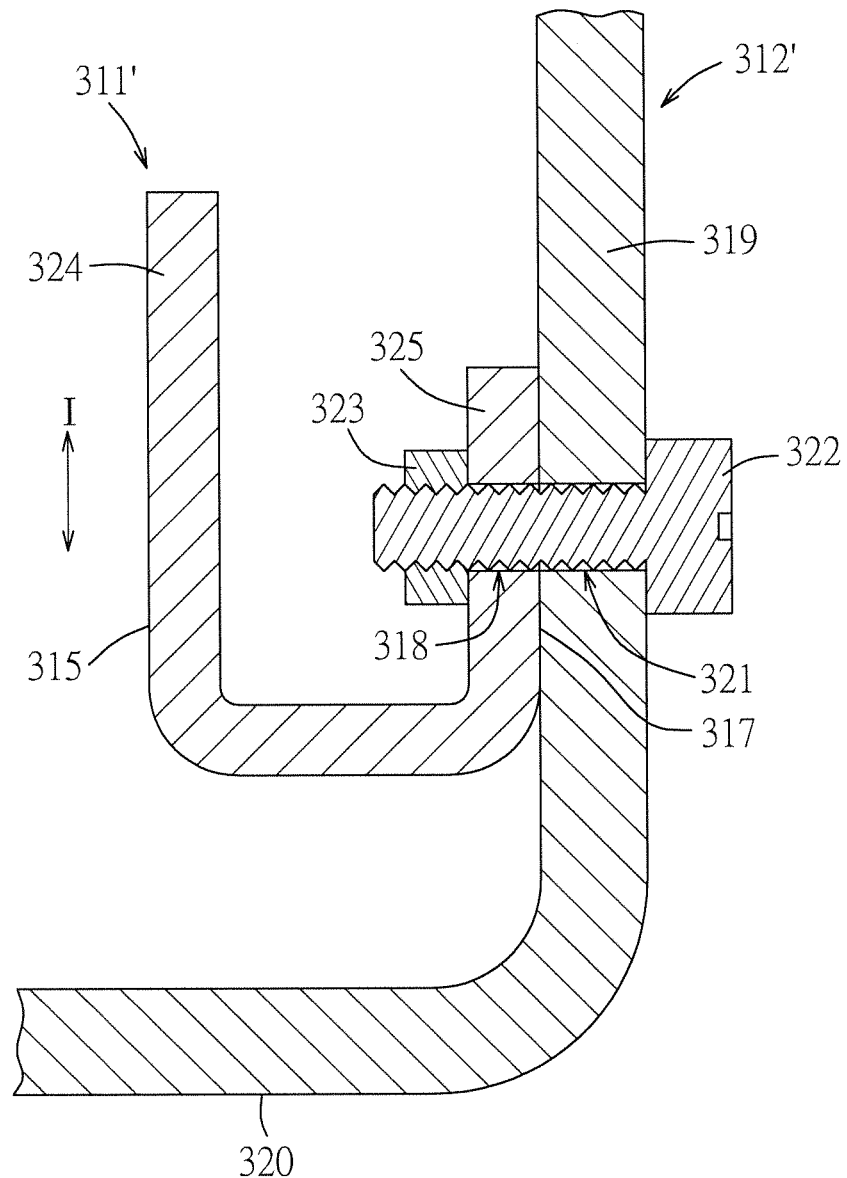
FIG. 13 is an enlarged fragmentary sectional view of the second preferred embodiment, illustrating how a first support of a current output support is fixed to a first rear plate section of a first conductive plate.

With reference to FIGS. 11 to 13, in this embodiment, the first conductive plate 311' has a substantially U-shaped cross section along the first direction (I), and includes a first front plate 324 having the front surface 315, and a first rear plate 325 rearwardly spaced apart from the first front plate 324 and having the rear surface 317. The first front plate 324 is formed with a plurality of arrays of first insertion holes 316 for insertion of and connection with the current conductive terminals 421 of the electrical connectors 4. Two through holes 318 (only one is shown in FIG. 13) are formed through the first rear plate 325.

The current output support 312' has a substantially recumbent U-shape. The first support 319 is formed with two first passage holes 321 (only one is shown in FIG. 13). Two first screws 322 (see FIG. 12) and two first nuts 323 (only one is shown in FIG. 13) are provided in this embodiment. Each first screw 322 is inserted through the aligned first passage hole 321 and first through hole 318, and engages the respective first nut 323, as best shown in FIG. 13, so that the first support 319 can be fixed to the first rear plate 325 of the first conductive plate 311'. In this embodiment, the current output support 312' includes two second supports 320 respectively connected to and extending transversely from two opposite ends of the first support 319. Each of the second supports 320 is used for connection with the corresponding terminals (not shown) of the motherboard of the system.

Figure 14:
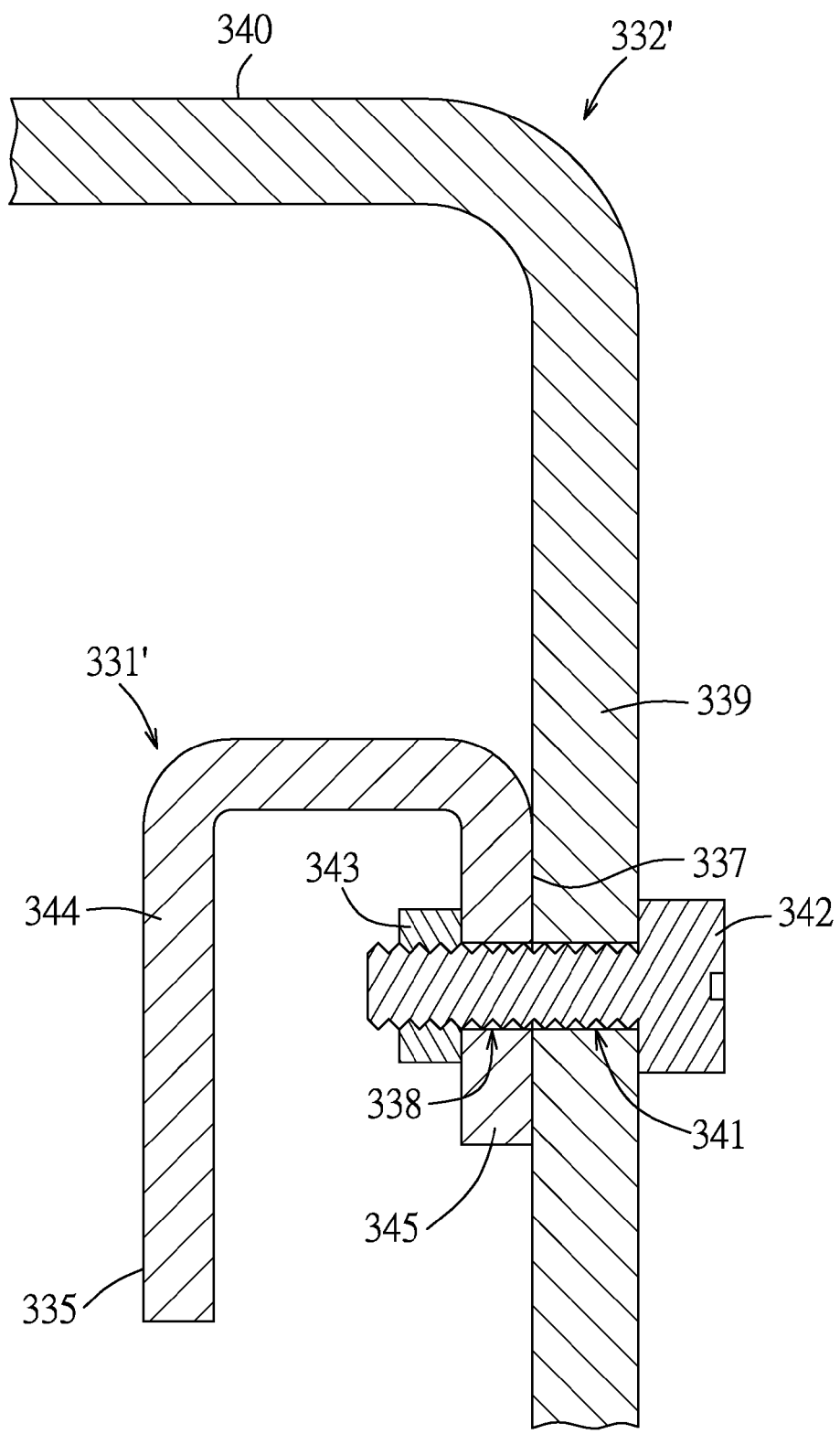
FIG. 14 is another enlarged fragmentary sectional view of the second preferred embodiment, illustrating how a first support of a ground support is fixed to a second rear plate section of a second conductive plate.

With reference to FIGS. 11, 12 and 14, the second conductive plate 331' has a substantially inverted U-shaped cross section along the first direction (I), and includes a second front plate 344 having the front surface 335, and a second rear plate 345 rearwardly spaced apart from the second front plate 344 and having the rear surface 337. The second front plate 344 is formed with a plurality of arrays of second insertion holes 336 for insertion of and connection with the ground terminals 422 of the electrical connectors 4. Two through holes 338 (only one is shown in FIG. 14) are formed through the second rear plate 345.

The ground support 332' has a substantially recumbent U-shape. The first support 339 is formed with two second passage holes 341 (only one is shown in FIG. 14). Two second screws 342 (see FIG. 12) and two second nuts 343 (only one is shown in FIG. 14) are provided in this embodiment. Each second screw 342 is inserted through the aligned second passage hole 341 and second through hole 338, and engages the respective second nut 343, as best shown in FIG. 14, so that the first support 339 can be fixed to the second rear plate 345 of the second conductive plate 331'. In this embodiment, the ground support 332' includes two second supports 340 respectively connected to and extending transversely from two opposite ends of the first support 339. Each of the second supports 340 is used for connection with the metal housing of the system.

Because each electrical connector 4 is assembled to the first front plate 324 of the first conductive plate 311' and the second front plate 344 of the second conductive plate 331', the first support 319 of the current output support 312' is fixed to the first rear plate 325 of the first conductive plate 311', and the first support 339 of the ground support 332' is fixed to the second rear plate 345 of the second conductive plate 331', the electrical connector 4, the current output support 312' and the ground support 332' will not affect each other during assembly, thereby enhancing the convenience of assembly.

In summary, because the first conductive terminals 41 of each electrical connector 4 are electrically connected to the signal control element 2, and the second conductive terminals 42 of each electrical connector 4 are electrically connected to the current transmission unit 31 and the ground transmission unit 33, current outputted from each power supply unit can be supplied directly to the motherboard of the system through each electrical connector 4 and the transmission mechanism 3. Through this, a transmission path of the current can be effectively shortened and loss of the current during transmission can also be reduced, so that the power distribution device 200, 210 can conduct large power and large current transmitting operation. Furthermore, because of the elongated structure and arrangement of the signal control element 2, the first conductive plate 311, 311' and the second conductive plate 331, 331', and because of the arrangement and disposition of the electrical connectors 4 on the signal control element 2, the first conductive plate 311, 311' and the second conductive plate 331, 331', the space occupied by the power distribution device 200, 210 in the metal housing of the system can be minimized. Moreover, because the current transmission unit 31 and the ground transmission unit 33 of the transmission mechanism 3 are made of metal conductive materials, the temperature will not easily rise during transmission of the current, so that the heat dissipation effect of the entire power distribution device 200, 210 is good. Additionally, because the assembling method of the electrical connectors 4 with the signal control element 2, the current transmission unit 31 and the ground transmission unit 33 is easy and quick, the assembly time thereof is shortened. Therefore, the objects of this invention can be achieved.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A power distribution device for connection with a plurality of power supply units, comprising:
    a signal control element;
    a transmission mechanism including a supply current transmission unit and a ground discharge transmission unit; and
    a plurality of electrical connectors respectively adapted for insertion of and connection with corresponding ones of the power supply units, each of said electrical connectors including a plurality of first conductive terminals electrically connected to said signal control element, and a plurality of second conductive terminals electrically connected respectively to said supply current transmission unit and said ground discharge transmission unit, said first conductive terminals being used for transmitting an electrical signal to said signal control element, said second conductive terminals being used respectively for transmitting current to said supply current transmission unit and to said ground discharge transmission unit;
    wherein said second conductive terminals of each of said electrical connectors are divided into a plurality of current conductive terminals electrically connected to said supply current transmission unit, and a plurality of ground terminals electrically connected to said ground discharge transmission unit;
    wherein said supply current transmission unit is made of a metal conductive material and includes a first conductive plate electrically connected to said current conductive terminals, and a current output support disposed on said first conductive plate, said ground discharge transmission unit being made of a metal conductive material and including a second conductive plate electrically connected to said ground terminals, and a ground support disposed on said second conductive plate; and,
    wherein said current conductive terminals, said ground terminals and said first conductive terminals are arranged along a first direction, each of said signal control element, said first conductive plate and said second conductive plate being elongated and having a long side and a short side, said first and second conductive plates and said signal control element being arranged along said first direction, said first direction being perpendicular to said long sides of said signal control element and said first and second conductive plates, and being parallel to said short sides of said signal control element and said first and second conductive plates.

2. The power distribution device as claimed in claim 1, wherein each of said signal control element, said first conductive plate and said second conductive plate further has a front surface, said electrical connectors being simultaneously disposed on said front surfaces of said signal control element and said first and second conductive plates, and being arranged spaced apart from each other along a second direction which is transverse to said first direction, said second direction being parallel to said long sides of said signal control element and said first and second conductive plates.

3. The power distribution device as claimed in claim 2, wherein each of said first and second conductive plates further has a rear surface, said current output support being mounted on said rear surface of said first conductive plate, said ground support being mounted on said rear surface of said second conductive plate.

4. The power distribution device as claimed in claim 3, wherein said first conductive plate is formed with a first through hole, said current output support being formed with a first passage hole aligned with said first through hole, said supply current transmission unit further including a first screw inserted into said first passage hole and said first through hole, and a first nut engaged to said first screw, said second conductive plate being formed with a second through hole, said ground support being formed with a second passage hole aligned with said second through hole, said ground discharge transmission unit further including a second screw inserted into said second passage hole and said second through hole, and a second nut engaged to said second screw.

5. The power distribution device as claimed in claim 4, wherein said first through hole extends through said front and rear surfaces of said first conductive plate, and said second through hole extends through said front and rear surfaces of said second conductive plate.

6. The power distribution device as claimed in claim 5, wherein said first conductive plate is further formed with a plurality of first insertion holes for insertion of said current conductive terminals of said electrical connectors, and said second conductive plate is further formed with a plurality of second insertion holes for insertion of said ground terminals of said electrical connectors.

7. The power distribution device as claimed in claim 4, wherein said first conductive plate has a substantially U-shaped cross section along said first direction and includes a first front plate having said front surface of said first conductive plate, and a first rear plate rearwardly spaced apart from said first front plate and having said rear surface of said first conductive plate, said first through hole extending through said first rear plate, said second conductive plate having a substantially inverted U-shaped cross section along said first direction and including a second front plate having said front surface of said second conductive plate, and a second rear plate rearwardly spaced apart from said second front plate and having said rear surface of said second conductive plate, said second through hole extending through said second rear plate.

8. The power distribution device as claimed in claim 7, wherein said first front plate is formed with a plurality of first insertion holes for insertion of said current conductive terminals of said electrical connectors, and said second front plate is formed with a plurality of second insertion holes for insertion of said ground terminals of said electrical connectors.

9. An assembling method of a power distribution device, comprising:
(A) aligning a plurality of electrical connectors with a signal control element, a supply current transmission unit, and a ground discharge transmission unit such that a plurality of first conductive terminals of each of said electrical connectors that are used for transmitting an electrical signal are directed respectively to said signal control element, and a plurality of second conductive terminals of each of said electrical connectors that are used for transmitting current are directed respectively to said supply current transmission unit and said ground discharge transmission unit; said supply current transmission unit being made of a metal conductive material and including a first conductive plate, said ground discharge transmission unit being made of a metal conductive material and including a second conductive plate;
(B) inserting said first conductive terminals of each of said electrical connectors into said signal control element, and inserting said second conductive terminals of each of said electrical connectors into corresponding ones of said supply current transmission unit and said ground discharge transmission unit;
(C) soldering said first conductive terminals of each of said electrical connectors to said signal control element so as to electrically connect said first conductive terminals to said signal control element, and soldering said second conductive terminals of each of said electrical connectors respectively to said supply current transmission unit and said ground discharge transmission unit so as to electrically connect said second conductive terminals respectively to said supply current transmission unit and said ground discharge transmission unit; and,
(D) fixing a current output support of said supply current transmission unit to said first conductive plate so as to electrically connect said current output support to said first conductive plate, and fixing a ground support of said ground discharge transmission unit to said second conductive plate so as to electrically connect said ground support to said second conductive plate;

wherein:
in (A), said second conductive terminals of each of said electrical connectors are divided into a plurality of current conductive terminals that face said first conductive plate, and a plurality of ground terminals that face said second conductive plate;

in (B), said current conductive terminals are inserted into said first conductive plate and said ground conductive terminals are inserted into said second conductive plate;

in (C), said current conductive terminals are soldered to said first conductive plate and said ground conductive terminals are soldered to said second conductive plate; and, wherein, in (A), said current conductive terminals, said ground terminals and said first conductive terminals are arranged along a first direction, said first and second conductive plates and said signal control element being arranged along said first direction, each of said signal control element, said first conductive plate and said second conductive plate being elongated and having a long side and a short side, said first direction being perpendicular to said long sides of said signal control element and said first and second conductive plates, and being parallel to said short sides of said signal control element and said first and second conductive plates.

10. The assembling method as claimed in claim 9, wherein, in (B), each of said signal control element, said first conductive plate and said second conductive plate further has a front surface, said electrical connectors being simultaneously disposed on said front surfaces of said signal control element and said first and second conductive plates, and being arranged spaced apart from each other along a second direction which is transverse to said first direction, said second direction being parallel to said long sides of said signal control element and said first and second conductive plates.

11. The assembling method as claimed in claim 10, wherein, in (D), each of said first and second conductive plates further has a rear surface, said current output support being fixed to said rear surface of said first conductive plate, said ground support being fixed to said rear surface of said second conductive plate.

12. The assembling method as claimed in claim 11, further comprising after (D), connecting a first guide wire between said signal control element and said current output support so as to electrically connect said first guide wire between said signal control element and said current output support, and connecting a second guide wire between said signal control element and said ground support so as to electrically connect said second guide wire between said signal control element and said ground support.

* * * * *